United States Patent [19]
Smentkowski et al.

[11] Patent Number: 5,840,426
[45] Date of Patent: Nov. 24, 1998

[54] METHOD FOR FLUORINATION OF DIAMOND SURFACES AND ASSOCIATED PRODUCT

[75] Inventors: Vincent S. Smentkowski, Pittsburgh; John T. Yates, Jr., Allison Park, both of Pa.

[73] Assignee: University of Pittsburgh of the Commonwealth System of Higher Education, Pittsburgh, Pa.

[21] Appl. No.: 798,311

[22] Filed: Feb. 7, 1997

Related U.S. Application Data

[62] Division of Ser. No. 521,894, Aug. 31, 1995, Pat. No. 5,665,435.

[51] Int. Cl.$^6$ ..................................................... B32B 9/00
[52] U.S. Cl. ......................................... 428/408; 428/696
[58] Field of Search ..................................... 428/408, 696

[56] References Cited

U.S. PATENT DOCUMENTS

| | | | |
|---|---|---|---|
| 4,873,115 | 10/1989 | Matsumura et al. | 427/249 |
| 5,145,711 | 9/1992 | Yamazaki et al. | 428/408 |
| 5,250,149 | 10/1993 | Kimoto et al. | 423/446 |
| 5,500,393 | 3/1996 | Nishibayashi et al. | 437/175 |

OTHER PUBLICATIONS

P. Cadman et al., "Identification of Functional Groups on the Surface of a Fluorinated Diamond Crystal by by Photoelectron Spectroscopy," *J.C.S. Chem. Comm.*, pp. 654–655, 1975.

CRC Handbook of Chemistry and Physics, CRC Press, Boca Raton, Florida, part 63 Edition, pp. 196–202, 1982–1983.

J.E. Field, "The Properties of Diamond," Academic, New York, New York 1979 (reference book only).

J.F. Morar et al., "C 1 s excitation studies of diamond (111). I. Surface core levels," *The American Physical Society*, Physical Review B, vol. 33, No. 2, pp. 1340–1345, Jan. 15, 1986.

J.F. Morar et al., "C 1 s excitation studies of diamond (111). II. Unoccupied surface states," *The American Physical Society*, Physical Review B, vol. 33, No. 2, pp. 1346–1349, Jan. 15, 1986.

P.K. Bachmann et al., "Emerging Technology of Diamond Think Films," *Chemical and Engineering News*, vol. 67, No. 20, pp. 24–39, May 15, 1989.

Donald E. Patterson et al., "Fluorinated Diamond Films, Slabs, and Grit," *Materials Research Society Symposium Proceedings*, vol. 140, pp. 351–356, 1989.

David S.Y. Hsu et al., "Fluorination of Diamond(111) Single Crystal Surfaces By $XeF_2$," *Fourth SDIO/IST ONR Diamond Technology Initiative Symposium*, Jul. 1989.

Robert Pool, "Diamond Films Sparkle As They Come to Market," *Science*, vol. 249, No. 4964, pp. 27–28, Jul. 6, 1990.

(List continued on next page.)

*Primary Examiner*—A. A. Turner
*Attorney, Agent, or Firm*—Diane R. Meyers; Arnold B. Silverman; Eckert Seamans Cherin & Mellott, LLC

[57] ABSTRACT

An improved method for the fluorination of a diamond surfaces comprises condensing a layer of perfluorinated alkyl iodides consisting of $C_nF_{2n+1}I$ (where n is a positive integer from 1 to 13) on the diamond surface, producing perfluorinated alkyl free radicals by photodecomposing C—I bonds of said perfluorinated alkyl iodides on the diamond surface, reacting the diamond surface with photochemically produced perfluorinated alkyl radicals thereby anchoring photochemically induced photofragments of the perfluorinated alkyl iodides to the diamond surface forming a perfluorinated alkyl layer, and decomposing the perfluorinated alkyl layer on the diamond surface to cause the fluorination of the diamond surface by atomic F. The method achieves greater than one fluorine atom per surface carbon atom chemisorbed on the diamond using $C_4F_9I$. A fluorinated diamond made by the above method is also disclosed wherein a fluorinating perfluoroalkyl iodide, $C_nF_{2n+1}I$, is selected from the group consisting of n=1 to 5. In one case, the fluorinating perfluoroalkyl iodide is $C_4F_9I$. In another case, it is $CF_3I$.

12 Claims, 10 Drawing Sheets

OTHER PUBLICATIONS

Barnaby J. Feder, "Industry's Growing Romance With Diamonds," *The New York Times*, Feb. 21, 1990, p. D5.

Daniel E. Koshland, Jr., "The Molecule of the Year," *Science*, vol. 250, No. 4988, Dec. 21, 1990.

Andrew Freedman et al., "Fluorination of diamond (100) by atomic and molecular beams," *Appl. Phys. Lett.*, vol. 57, No. 12, Sep. 17, 1990.

Andrew Freedman et al., "Fluorinated of Diamond (100) By Atomic and Molecular Beams," *New Diamond Science and Technology*, MRS Int. Conf. Proc., vol. 2, pp. 321–236, Sep. 23–27, 1990.

Mat. Res., *Soc. Symp. Proc.*, vol. 204, p. 571, 1991. (Not available.).

*Proc. Electro Chem. Soc.*, vol. 91, p. 494, 1991. (Not available.).

J.E. Field, "The Properties of Natural and Synthetic Diamonds," *Academic*, New York, New York (1992). (Reference book.).

S.K. Ritter, "Fluorine Chemistry Branches Out From Its Traditional Focus,", *Chemical and Engineering News*, vol. 73, No. 9, Feb. 27, 1995.

METHOD FOR FLUORINATION OF DIAMOND SURFACES AND ASSOCIATED PRODUCT

This is a division, of application Ser. No. 08/521,894, filed Aug. 31, 1995 now U.S. Pat. No. 5,665,435.

BACKGROUND OF THE INVENTION

1. Field of the Invention

The present invention relates to the photodecomposition of all perfluoroalkyl iodides of general formula $C_nF_{2n+1}I$ (where n is a positive integer from 1 to 13) on diamond surfaces as an improved method of fluorination of a diamond surface. This invention also relates to using $C_nF_{2n+1}I$ molecules as photochemically activated fluorinating agents, photodecomposing the fluoroalkyl iodide molecule, attachment of the photofragments to the diamond surface and thermal decomposition of the fluoroalkyl ligands. The fluorinated layer produced by this new method has been found to exhibit high thermal stability, comparable to surface layers produced by direct fluorination of diamond with F atoms. A fluorinated diamond surface is made by the disclosed method.

2. Description of the Prior Art

The surface properties of many materials may be significantly improved by the use of diamond film coatings. Diamond films exhibit physical properties making possible the fabrication of long-lived cutting tools, biological implants, optical disks, lenses and windows. [P. K. Bachmann et al., *Chemical Engineering News*, 67 (20), 24 (1989); J. E. Field, "The Properties of Diamonds", Academic, New York (1979); J. E. Field, "The Properties of Natural and Synthetic Diamonds", Academic, New York (1992); R. Pool, *Science*, 249, 27 (1990); B. J. Feder, *The New York Times*, Feb. 21, 1990, p. C4; D. E. Koshland, Jr., *Science*, 250, 1637 (1990).] In each of these applications, it is desirable to modify the properties of the outer surface of the diamond film itself in order to build in special surface properties of the protective diamond coating.

The chemical modification of diamond surfaces provides one route for producing useful surface properties. One modifier which offers promise for the improvement of the behavior of diamond surfaces is fluorine. [S. K. Ritter, *Chemical and Engineering News*, 73 (9), 39 (1995).] It has been shown that the strong surface C-F bonds [*Handbook of Chemistry and Physics*, CRC Press, Boca Raton, Fla. (1982–83), 63 Edition, p. F-199] on diamond provide enhanced lubricity [D. S. Y. Hsu et al., *Fourth SDIO/IST ONR Diamond Technology Initiative Symposium*, July 1989] and enhanced stability under oxidizing conditions at elevated temperatures [D. E. Patterson et al., *Mat. Res. Soc. Symp. Proc.*, 140, 351 (1989)].

Until now, the fluorination of diamond surfaces has been accomplished only with extreme surface treatment methods involving molecular $F_2$, atomic F [A. Freedman et al., *Appl. Phys. Lett.*, 57, 1194 (1990); *Mat. Res. Soc. Symp. Proc.*, 204, 571 (1991); *Proc. Electrochem. Soc.*, 91, 494 (1991); *New Diamond Sci. Technol., Proc. Internat, Conf.*, 2, 321 (1991)], $XeF_2$ [J. F. Morar et al., *Phys. Rev. B.*, 33, 1340 (1986); J. F. Morar et al., *Phys. Rev. B.*, 33, 1346 (1986)], and fluorine-containing plasmas [P. Cadman et al., *J. Chem. Soc. Chem. Comm.*, 654 (1975)]. Each of these surface modification methods involves handling corrosive gases under harsh treatment conditions. In addition, only partial fluorination of the diamond surfaces studied has been achieved using these extreme methods. To the best of the Applicants' knowledge, no one to date has reported the attachment of long chain fluoroalkyl species to diamond surfaces.

In spite of previous methods involving elemental $F_2$, atomic F, plasmas containing fluorine species and $XeF_2$, materials which are hard to handle and need special techniques, there still remains a need for an improved method which provides an improved chemical reaction route for producing a fluorinated diamond surface which is stable to high temperatures.

SUMMARY OF THE INVENTION

The present invention has met the above-described need. The present invention provides a method of using all perfluorinated alkyl iodides ($C_nF_{2n+1}I$) where n is a whole integer from 1 to 13 for producing a fluorinated diamond surface.

The improved method for the fluorination of a diamond surface comprises depositing a layer of perfluorinated alkyl iodides consisting of $C_nF_{2n+1}I$ molecules (where n is from 1 to 13) on the diamond surface, producing perfluorinated alkyl radicals by photodecomposing the C-I bonds of the perfluorinated alkyl iodide on the diamond surface and reacting the diamond surface with the photochemically produced perfluorinated alkyl radicals. The photochemically induced photofragments of the perfluorinated alkyl iodide molecules are anchored to the diamond surface forming a perfluorinated alkyl layer and the fluorinated alkyl layer is decomposed on the diamond surface to produce chemisorbed fluorine on the diamond surface. The method achieves greater than one fluorine atom per surface carbon atom on the diamond surface. The method produces thermally stable chemisorbed fluorine on the diamond surface. Following photodecomposition of the perfluoroalkyl iodide on the diamond surface, heating from about 120K to 300K to desorb excess perfluoroalkyl iodide on the diamond surface, and then employing a temperature of about 300K to 700K to decompose the perfluorinated alkyl layer, a layer of chemisorbed fluorine is produced on the diamond surface.

A fluorinated diamond is made by the above method selecting the perfluorinated alkyl iodide, $C_nF_{2n+1}I$, selected from the group consisting of wherein n=1 to 5.

Attachment of fluorine to the diamond surface, using $C_4F_9I$ as a representative starting material, is characterized by band bending as surface states on the diamond are occupied through chemisorption and this results in shifting of the C(1s) level as measured by X-ray photoelectron spectroscopy. The iodine on the diamond surface is removed by heating from about 120K to 400K. A chemisorbed $C_4F_9$ surface species is stable from about 120K to 500K and then decomposes to produce chemisorbed fluorine on the diamond. The chemisorbed fluorine remains stable on the diamond surface from about 500K to about 1500K, preferably 700K to 1500K. The fluorinated diamond surface has thermal stability to 1500K. The same surface chemistry occurs on hydrogen-passivated diamond and HI species are detected following irradiation of $C_4F_9I$.

It is an object of this invention to provide an improved method for the fluorination of diamond surfaces using radiation-induced or ultraviolet light-induced activation of perfluoroalkyl iodide molecules adsorbed on the diamond surface to produce perfluoroalkyl groups chemically bound to the diamond.

It is an object of this invention to provide a method wherein the anchored fluoroalkyl groups are an easily controlled source of fluorine for the production of chemisorbed fluorine on the diamond surface, by subsequent thermal decomposition.

It is an object of this invention to provide a method and product wherein the presence of passivating surface C-H groups on the diamond does not inhibit fluorination by this method.

It is an object of the present invention to provide a method and a product where fluorinated diamond surfaces have a low coefficient of friction.

It is an object of this invention to provide an improved method and product wherein there is enhanced diamond resistance to oxidation by $O_2$ and atomic O.

It is another object of this invention to provide a new method and product wherein the fluorinated layer on a diamond surface exhibits high thermal stability.

It is another object of this invention to provide a method and product wherein fluorinated layers produced by the present invention have comparable properties to layers produced by direct fluorination of the diamond with F atoms.

It is yet another object of this invention to provide an improved new method and product wherein more than one fluorine atom is deposited per surface carbon atom on the diamond.

These and other objects of the invention will be more fully understood from the following description of the invention and references to the illustrations and appended claims hereto.

DESCRIPTION OF THE PREFERRED EMBODIMENT

Figure 1:
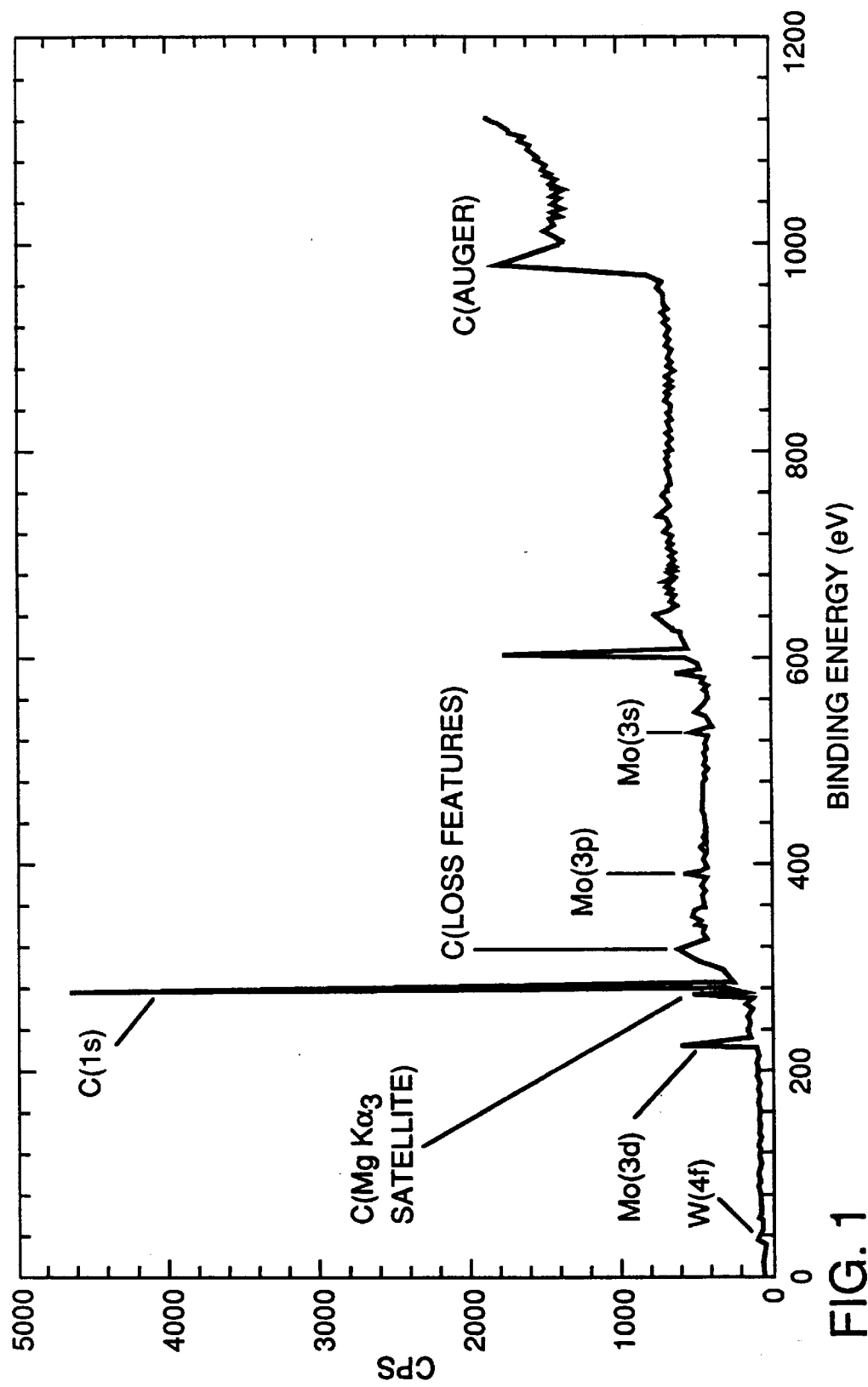
FIG. 1 shows broad scan X-ray photoelectron spectroscopy (XPS) of the clean diamond obtained following heating to 1450K.

The present invention presents an improved method of fluorinating a diamond surface which is capable of depositing more than one fluorine atom per surface carbon atom on the diamond. The fluorinated alkyl layer achieved by this method decomposes between about 300K and 700K to produce a highly stable form of chemisorbed fluorine on the diamond surface which is thermally stable from about 500K to 1500K, preferably about 700 to 1500K. The fluorinated diamond surface has thermal stability to 1500K.

The improved method for the fluorination of a diamond surface comprises depositing a layer of perfluorinated alkyl iodides consisting of $C_nF_{2n+1}I$ (where n is a positive integer 1 to 13) on the diamond surface, producing perfluorinated alkyl radicals by photodecomposing the C-I bonds of the perfluorinated alkyl iodides on the diamond surface and reacting the diamond surface with the photochemically produced perfluorinated alkyl radicals. The photochemically induced photofragments of the perfluorinated alkyl iodide molecules are anchored to the diamond surface forming a perfluorinated alkyl layer and this layer is decomposed on the diamond surface to produce chemisorbed fluorine on the diamond surface. The method produces more than one fluorine atom per surface carbon atom on the diamond surface. The method also produces thermally stable chemisorbed fluorine on the diamond surface. The method employs perfluorinated alkyl iodides $C_nF_{2n+1}I$ selected from the group wherein n=1 to 5 increasing the fluorination of the diamond surface as the size of the perfluoroalkyl iodide molecules increases. For n=4 the method also employs the photodecomposition of the perfluoroalkyl iodide on the diamond surface, heating from 120K to 300K to desorb excess perfluoroalkyl iodide on the diamond surface, employing a temperature of about 300K to 700K to decompose the perfluorinated alkyl layer to produce the chemisorbed fluorine on the diamond surface. Simultaneously, iodine atoms from the perfluoroalkyl groups extract hydrogen atoms from the diamond surface making surface sites available for perfluoroalkyl group attachment.

A fluorinated diamond was made by the above method selecting the fluorination perfluoroalkyl iodide from the group consisting of $CF_3I$, $C_2F_5I$, $C_3F_7I$, $C_4F_9I$, $C_5F_{11}I$, $C_6F_{13}I$, $C_7F_{15}I$, $C_8F_{17}I$, $C_9F_{19}I$, $C_{10}F_{21}I$, $C_{11}F_{23}I$, $C_{12}F_{25}I$ and $C_{13}F_{27}I$. The fluorinated diamond was made using the perfluoroalkyl iodide $C_4F_9I$. The florinated diamond was also made using the fluorinating perfluoroalkyl iodide $CF_3I$.

Attachment of fluorinated groups to the diamond surface is characterized by band bending as surface states on the diamond are occupied through chemisorption. The C(1s) binding energy of the fluorinated diamond increases indicating removal of surface states on the diamond by chemisorbed fluorine. For n=4 the iodine on the diamond surface is removed by heating from about 120K to 400K. The chemisorbed $C_4F_9$ surface species is stable from about 120K to 300K and then produces chemisorbed fluorine on the diamond over the temperature range 300K to 700K. The chemisorbed fluorine remains stable on the diamond surface from about 500K to 1500K, preferably about 700K to 1500K. The fluorinated diamond surface has thermal stability to 1500K.

EXAMPLE

The two polished natural diamond (100) crystals (diamond #1 (D#1) and diamond #2 (D#2)); type II a, 6 mm×6 mm×0.5 mm) used in this work have been oriented to within 1° of the (100) orientation. Prior to mounting and insertion into the vacuum system, the crystals were cleaned using accepted wet chemical cleaning procedures. The diamond crystals were indirectly heated by contact with a Mo support can containing a shielded W heating filament which heats the crystal/support assembly either by radiation or by electron bombardment (to>1450K). The temperature of the diamond crystals was accurately measured using two independent W26%Re vs. W5%Re thermocouples which were internally mounted inside the diamond inside laser drilled holes which enter the 0.5 mm thick crystal edges. The maximum deviation between the two diamond thermocouples was 15K at 1450K.

The base pressure in the ultrahigh vacuum system was $\sim 1 \times 10^{-10}$ Torr with a working pressure of $\sim 3 \times 10^{-10}$ Torr.

The diamond was cleaned by heating in vacuum to 1450K (two times), following cycles of atomic D adsorption and desorption. Conditioning of the diamond crystal in atomic D was carried out in a high pressure cell which was isolated from the UHV analysis chamber by a gate valve. Atomic D exposures were made using a hot W filament (~1800K) in $D_2(g)$ with line-of-sight geometry to the diamond (100) crystal. Reproducible C(1s) binding energies, integrated C(1s) yields, and constant C(1s) line widths were achieved in this manner. It has been shown that irreproducible surfaces may result for other diamond surface preparation procedures.

A broad scan XP spectrum of diamond (100) following conditioning in atomic D and cleaning at 1450K is shown in FIG. 1. The spectrum (and expanded regions of the spectrum—not shown) indicate that neither graphite nor surface oxygen impurities are present. Previous studies indicate that chemisorbed D is also absent following heating to 1450K. Mo features from the Mo support are seen as well as small W features from the thermocouples.

Exposure of the diamond (100) crystal to an effusive beam of $C_4F_9I(g)$ or $CF_3I(g)$ was achieved in the ultrahigh vacuum system by reproducibly bringing the diamond crystal to within 4 mm of a 5 mm×5 mm orifice which accurately delivers the fluoroalkyl iodide beam to the diamond. The flow rate was governed by a nominal $2\mu$ diameter pinhole in the gas delivery system, using a Baratron capacitance manometer for measuring the backing pressure. Absolute fluoroalkyl iodide fluxes were calculated using effusion measurements for $N_2(g)$ and for Xe(g). The effusion rate of the doser [$(1.90\pm0.06)\times10^{14}$/torr second for a hypothetical 1 amu molecule] remained constant to within ±3% for four years.

Figure 2:
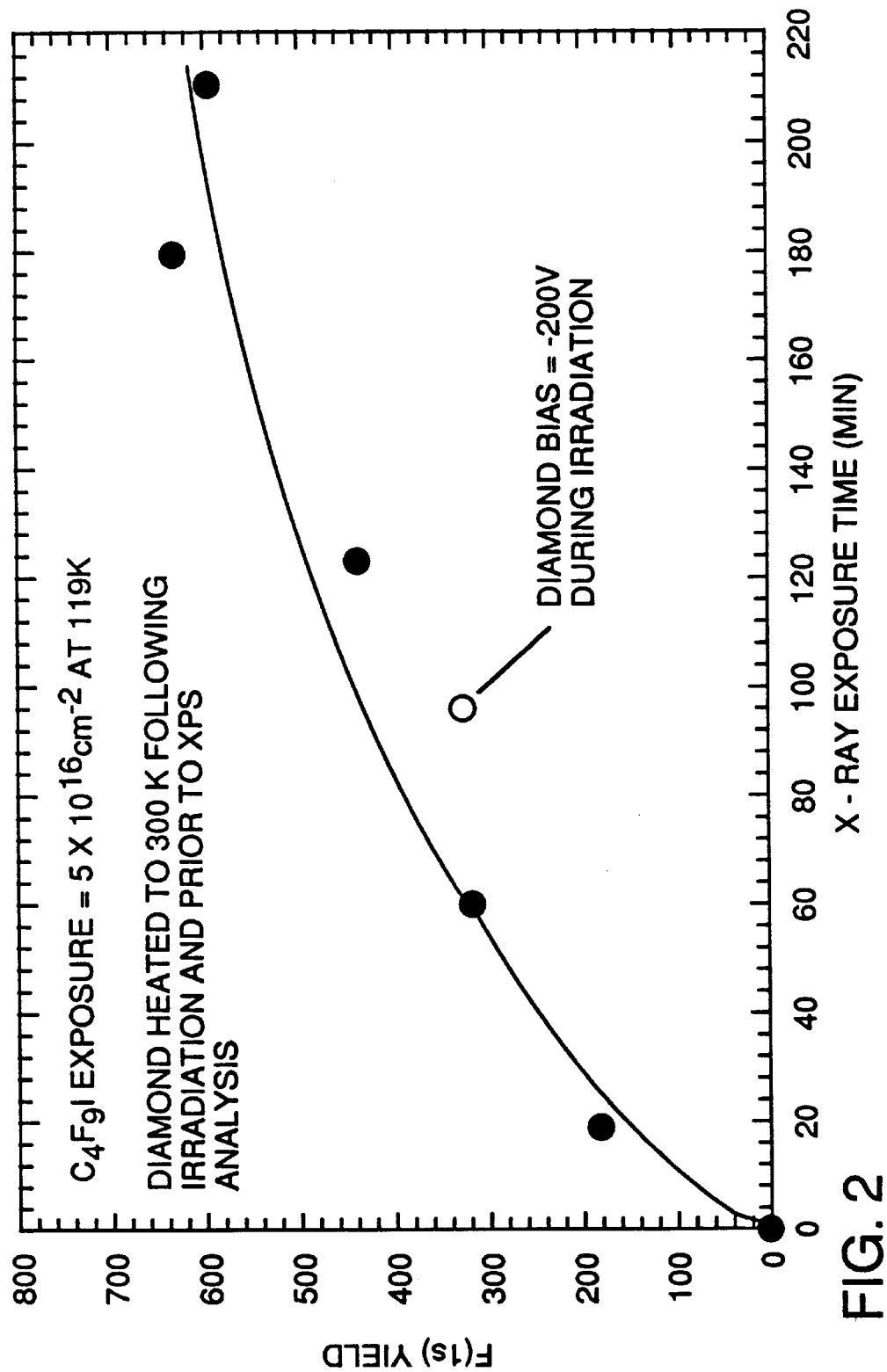
FIG. 2 is a plot of F(1s) yield from chemically-bound F as a function of X-ray exposure time for $C_4F_9I$ layers on diamond (100) at about 119K.

The role of X-radiation in the fluorination of the diamond surface is demonstrated by condensing a thick layer of $C_4F_9I$ on the surface at 119K, irradiating for various times, and then desorbing the remaining $C_4F_9I$ by heating the surface to 300K. This leaves a strongly-bound chemisorbed F layer which yields a F(1s) XP spectrum with a feature at a binding energy of 687.7 eV. The development of the chemisorbed layer with increasing irradiation is shown by FIG. 2. In the absence of X-ray irradiation, no dissociative chemisorption occurs. To avoid the possibility that these effects are due to stray electrons originating from the X-ray source, a control experiment with a bias voltage on the diamond of −200 V is also shown in FIG. 2 (open data point), and no significant effect on the results was observed.

The XPS characteristics of the diamond surface were measured with a Leybold-Heraeas EA-11 spectrometer, using Mg Kα X-ray radiation. Cu Lα impurity X-ray ghost features were also present. The X-ray source operated at 15 kV; 20 mA; 300 W. The spectrometer pass energy was set at $\Delta E=45$ eV, and 30 scans of the desired energy range were obtained (unless noted otherwise). The binding energy scale was calibrated using a sputter-cleaned Au or Cu standard which was positioned at the focal point of the XPS. During experiments, the small Mo(3d) features originating from the clean Mo surface support also verified that the energy scale remained fixed. The maximum binding energy errors were ±0.05 eV. Separate studies indicate that negligible (0.018 eV) surface charging occurs under the measurement conditions employed here. All XPS core level intensities are integrated over the line width, using a linear baseline.

Figure 3:
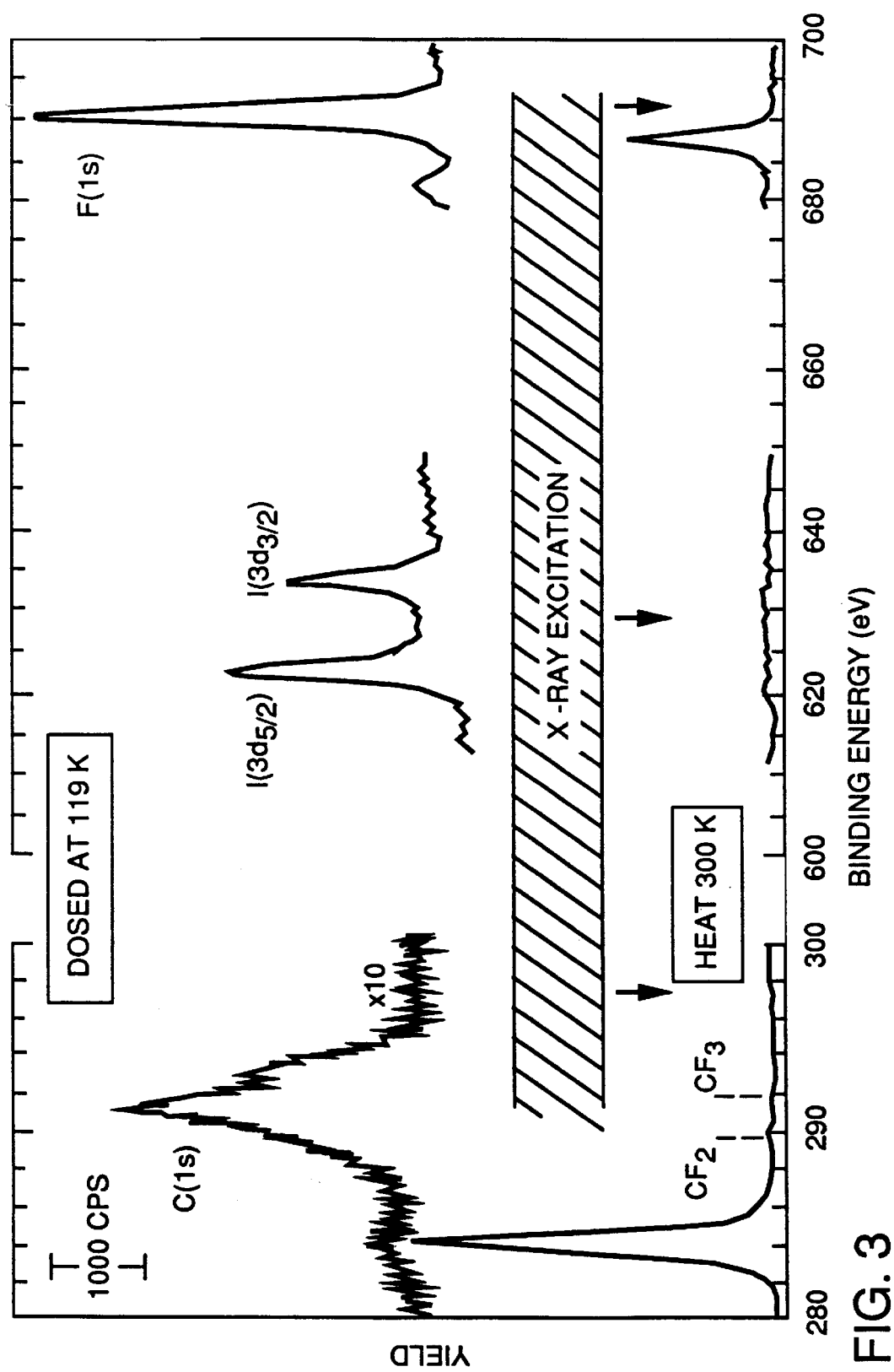
FIG. 3 shows XP spectra of $C_4F_9I$ on diamond (100) at about 119K (top), and the transformation which occurs following irradiation and heating to about 300K.

The integrated XPS intensities of the F(1s), I(3d) and diamond C(1s) transitions following exposure of the surface to $5 \times 10^{16}$ $C_4F_9I/cm^2$ at 119K are shown in FIG. 3. This results in the deposition of a thick condensed layer of $C_4F_9I$. Both $CF_2$ and $CF_3$ groups are detected in the C(1s) spectrum of the thick overlayer. Upon heating to 300K, both the F(1s) and I(3d) intensities decreased significantly as molecular $C_4F_9I$ desorption occurred. The removal of the thick $C_4F_9I$ layer is accompanied by an increase of the diamond-C(1s) intensity as overlayer screening effects are decreased. It is seen in FIG. 3 that both $CF_3$- and $CF_2$-C(1s) features are observed on the diamond (100) surface following photolysis of the overlayer and subsequent removal of unphotolyzed $C_4F_9I$ by desorption at 300K. In addition, both I(3d) and F(1s) features corresponding to chemisorbed species on the diamond surface are visible following photolysis and removal of the remaining $C_4F_9I$ layer by heating.

Temperature programming of the diamond crystal was achieved between about 119K and 1450K using a feedback controller. All heating cycles were carried out at a controlled heating rate of ~3.4K/s, followed by immediate cooling from the maximum temperature reached in each cycle.

Mass spectrometric measurements of desorbing species were carried out using a line-of-sight geometry from the crystal into the differentially pumped mass spectrometer ionizer, through a 2.0 mm diameter aperture mounted on the quadrupole mass spectrometer (QMS) axis. The front of face of the diamond (100) crystal was reproducibly positioned 1 mm from the QMS aperture. Spurious electron bombardment effects on the diamond surface from the QMS thermionic emitter were avoided by using a −100 V bias on the aperture. Temperature programmed desorption (TPD) was monitored with a VTI multiplex controller which involves a cycle of 3 mass peaks (as well as temperature readings) being monitored in a period of ~0.4s.

LEED experiments were performed using a homebuilt 4 grid (2 hemispherical and 2 flat) detector which utilizes dual microchannel plate amplification prior to a phosphor display screen. A Sharp video camera was used to record the LEED data during data acquisition. A Varian model 981–2145 electron gun with added x and y deflection plates (in addition to an external gimble assembly) was used for the LEED studies. The primary energy ($E_p$) of the incident electrons was 135 eV<$E_p$<185 eV, and the current measured at the crystal (vs. ground) was <1 nA.

$C_4F_9I$ (97% min. purity) and $CF_3I$ (99.7% min. purity) were obtained from PCR Inc. and were used without further purification, except for freeze-pump-thaw cycles for $C_4F_9I$.

X-radiation was able to dissociate both $C_4F_9I$ and $CF_3I$ when deposited as condensed layers on the diamond surface at about 119K. All measurements were made following a uniform X-ray exposure of about 180 minutes to the fluoroalkyl iodide overlayer. Following thermal desorption of the excess fluoroalkyl iodide, diamond fluorination was observed.

Figure 4:
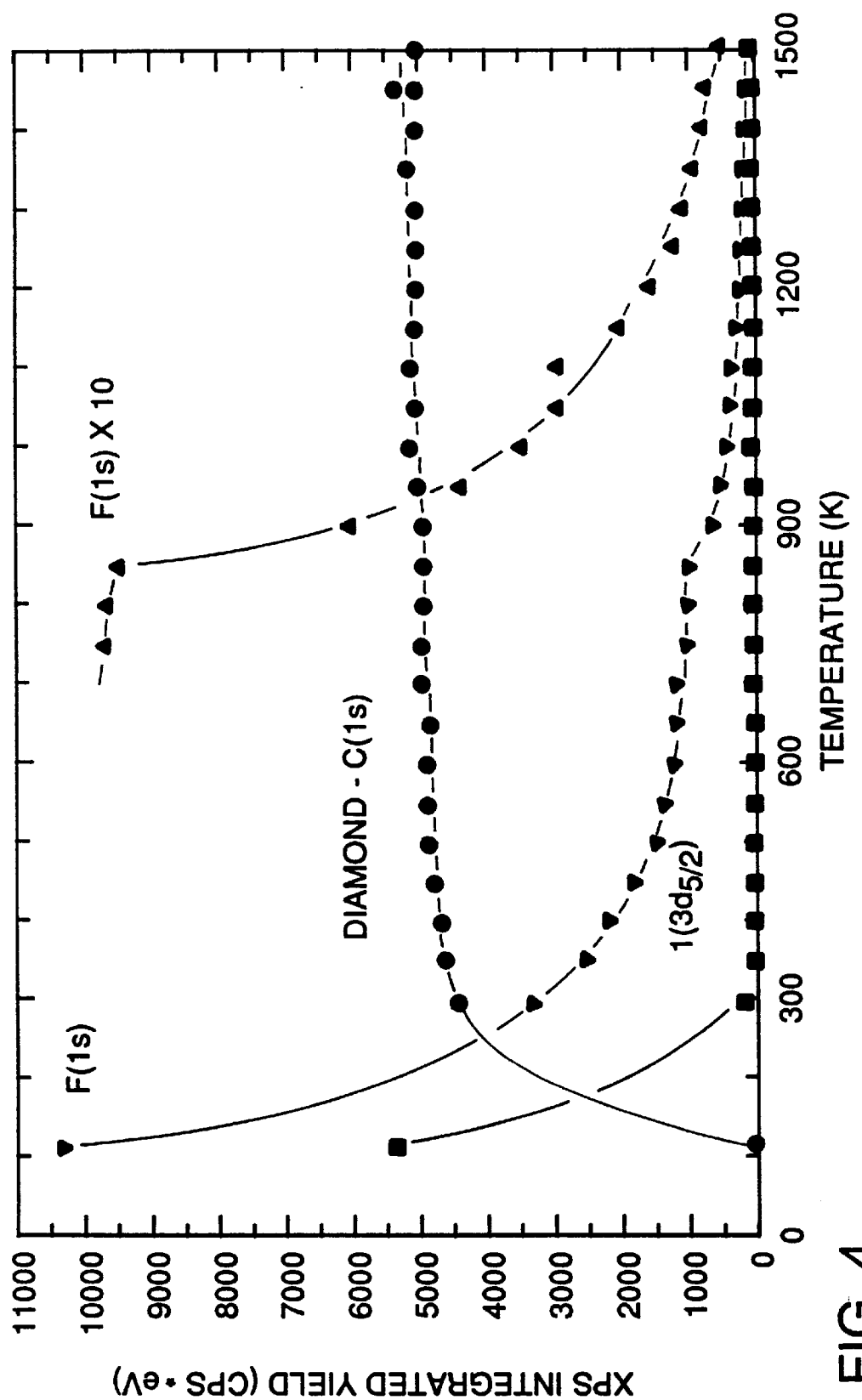
FIG. 4 is a plot of the thermal behavior of a $C_4F_9I$ layer on diamond (100) following irradiation and heating up to elevated temperatures.

The behavior of the F(1s), I($3d_{5/2}$) and the diamond C(1s) intensities as the diamond (100) surface is heated in ultrahigh vacuum after fluorination by X-ray irradiation of the $C_4F_9I$ overlayer is shown in FIG. 4. Upon heating, the I(3d$_{5/2}$) intensity decreases to zero at 400K. Heating to ~650K causes a slow asymptotic decrease in the F(1s) intensity and the diamond C(1s) intensity increased further. Above ~900K, the F(1s) intensity slowly decreased as the diamond surface was heated to 1500K.

Figure 5:
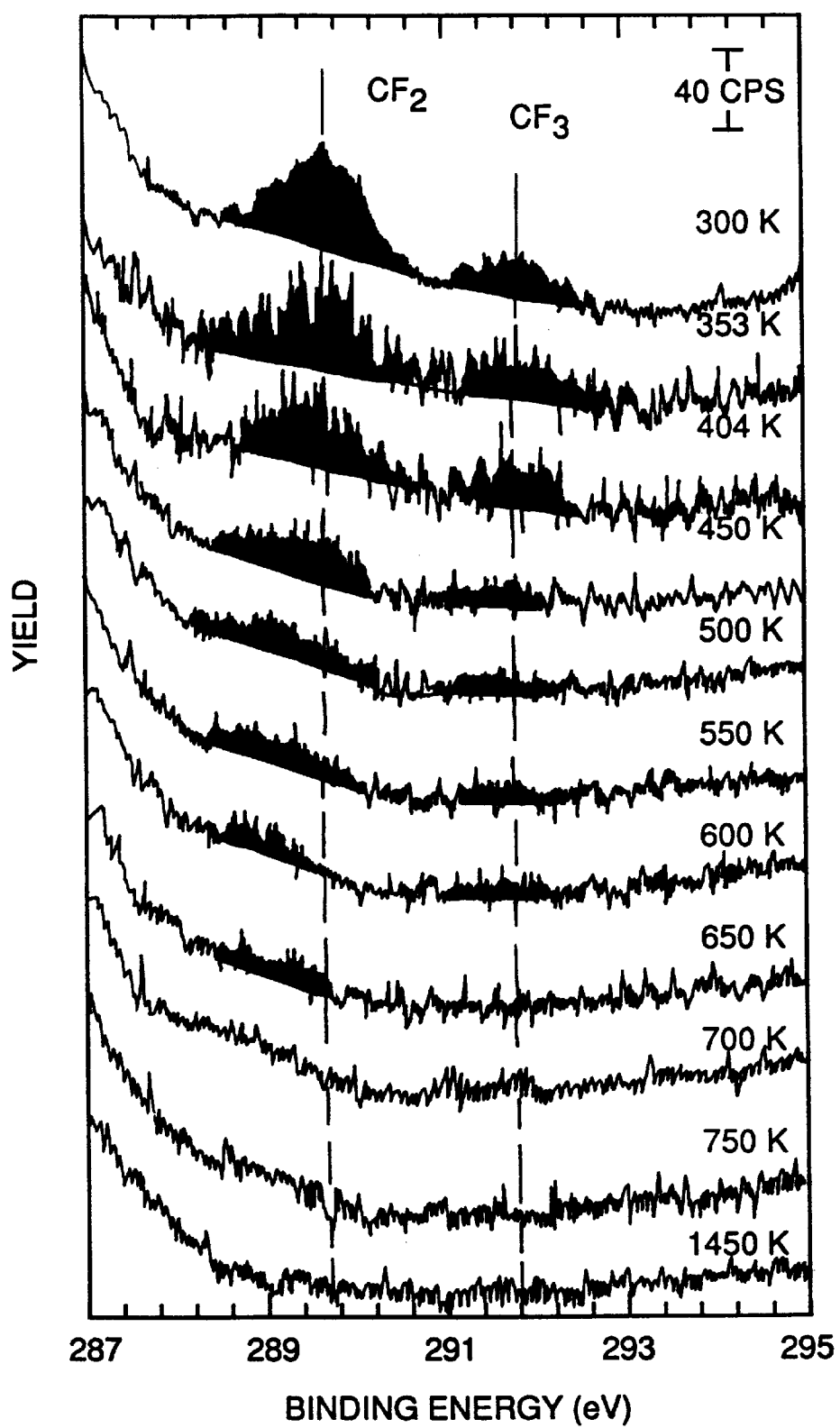
FIG. 5 shows changes in $CF_2$- and $CF_3$-XPS features from anchored $C_4F_9$ species following X-irradiation and upon heating.

The changes which are observed in the C(1s) features corresponding to CF$_2$ and CF$_3$ moieties during heating are shown in FIG. 5. The ratio of the integrated intensities of the two C(1s) features, CF$_2$/CF$_3$=2.8±0.1 for the top spectrum of FIG. 5. For the C$_4$F$_9$ chemisorbed species, this ratio is 3.0 in the absence of self-screening effects. This ratio remained approximately constant at ~2.8±0.3 in the temperature range from 300K to 650K as the anchored C$_4$F$_9$ species gradually decompose. This indicates that anchored CF$_3$(CF$_2$)$_{3-}$ species slowly thermally decompose on the surface in the temperature range 300K to ~700K, leaving chemisorbed F.

Figure 6:
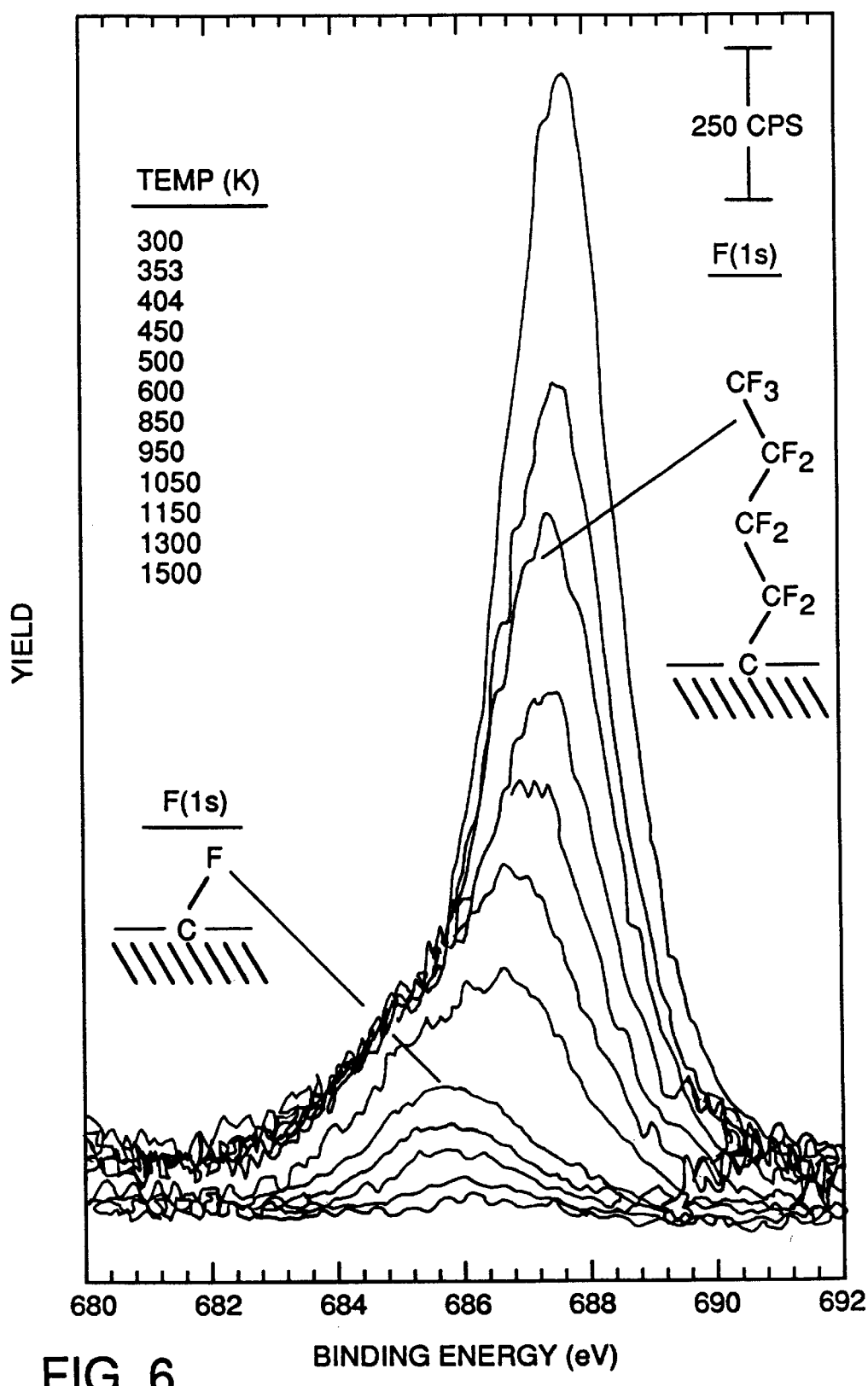
FIG. 6 shows changes in F(1s) XPS intensity as a function of heating following $C_4F_9I$ irradiation.

The F(1s) spectra obtained as a function of heating temperature for the layer produced from C$_4$F$_9$I photolysis are shown in FIG. 6. At 300K, two overlapping F(1s) transitions with binding energies of 687.7 eV and ~685.8 eV are observed. Heating from 300K to ~850K caused the yield of the 687.7 eV F(1s) transition to decrease to near zero. Since the CF$_3$- and CF$_2$-C(1s) intensities also decrease to zero in approximately this same temperature range. The F(1s) transition at 687.7 eV is assigned to the fluorine atoms in the CF$_3$(CF$_2$)$_{3-}$ surface species chemisorbed on the diamond substrate. The second F(1s) transition at a binding energy of ~685.8 eV is more clearly revealed as the C$_4$F$_9$ surface species thermally decompose. This second F(1s) feature begins to decrease in intensity at ~850K and continues to do so up to 1500K. The ~685.8 eV F(1s) feature is assigned to chemisorbed F on the diamond (100) surface.

Figure 7:
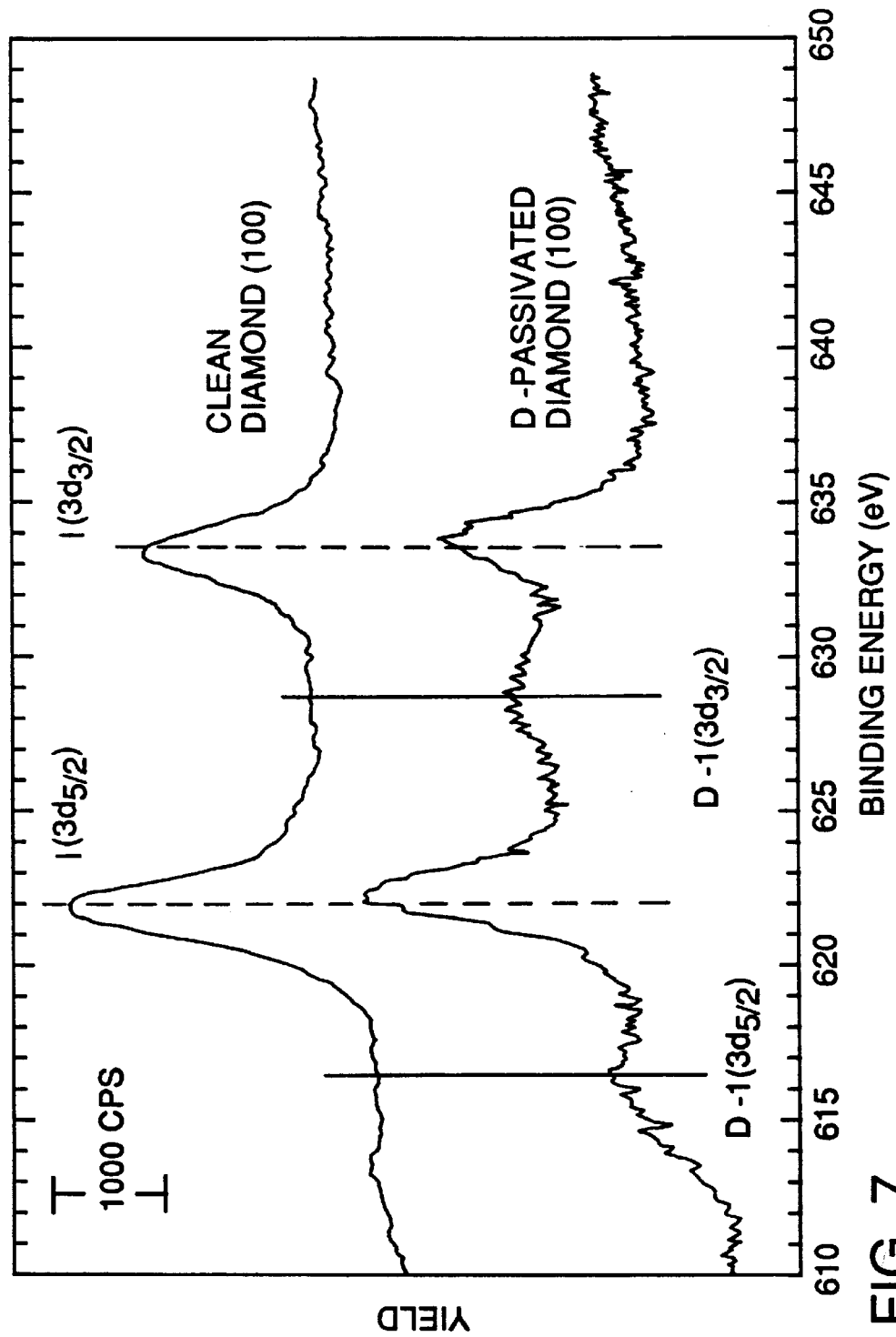
FIG. 7 is an XP spectra of the I(3d) region following X-irradiation of the $C_4F_9I$ layer on a hydrogen-passivated diamond surface.

Semiconductor surfaces are often passivated by the chemisorption of surface H which caps the dangling bonds. This effect is investigated by carrying out the photolysis of a C$_4$F$_9$I overlayer on D-passivated diamond (100). X-ray irradiation of the layer causes two pairs of spin-orbit split I(3d) states to appear as shown in FIG. 7. The higher binding energy pair of I(3d) states is due to iodine in the undecomposed C$_4$F$_9$I molecules held on the surface. The second pair of states (shifted above 5 eV to lower binding energy) is assigned to DI molecules trapped in the C$_4$F$_9$I condensed layer at 119K. These results indicate that I atoms released by photolysis of the C-I bond effectively attack surface C-D bonds on the diamond, causing D abstraction at 119K. It is reasonable to expect that the abstraction in these experiments would also occur for surface C-H groups since D and H would behave similarly. Chemical bonding of F to surface sites on the diamond (100) occurs on heating the surface, indicating that hydrogen passivation is ineffective for photochemical fluorination.

Figure 8:
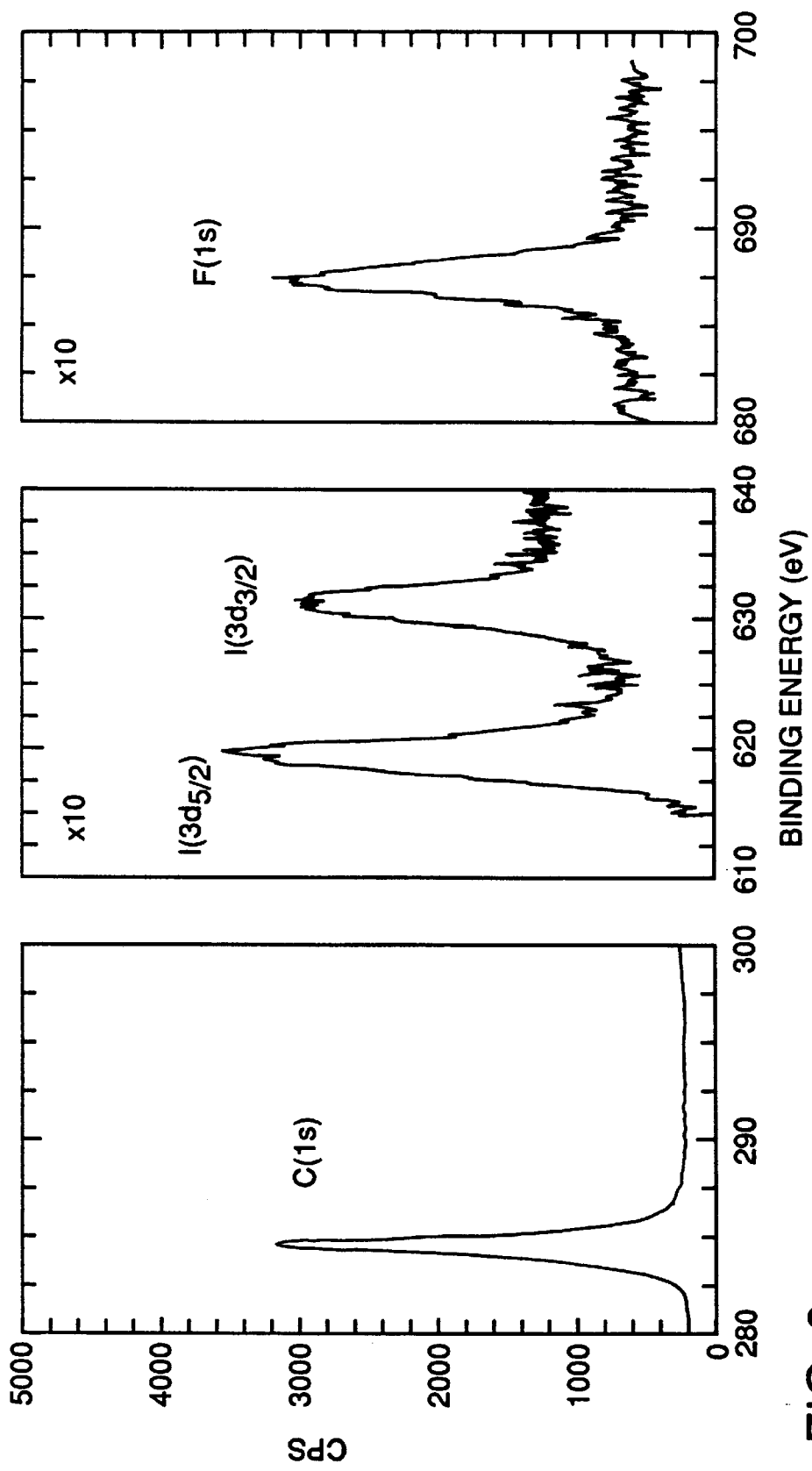
FIG. 8 shows XP spectra of the C(1s), I(3d), and F(1s) regions following a $CF_3I$ exposure of $5 \times 10^{16} cm^{-2}$ at about 119K.
Figure 9:
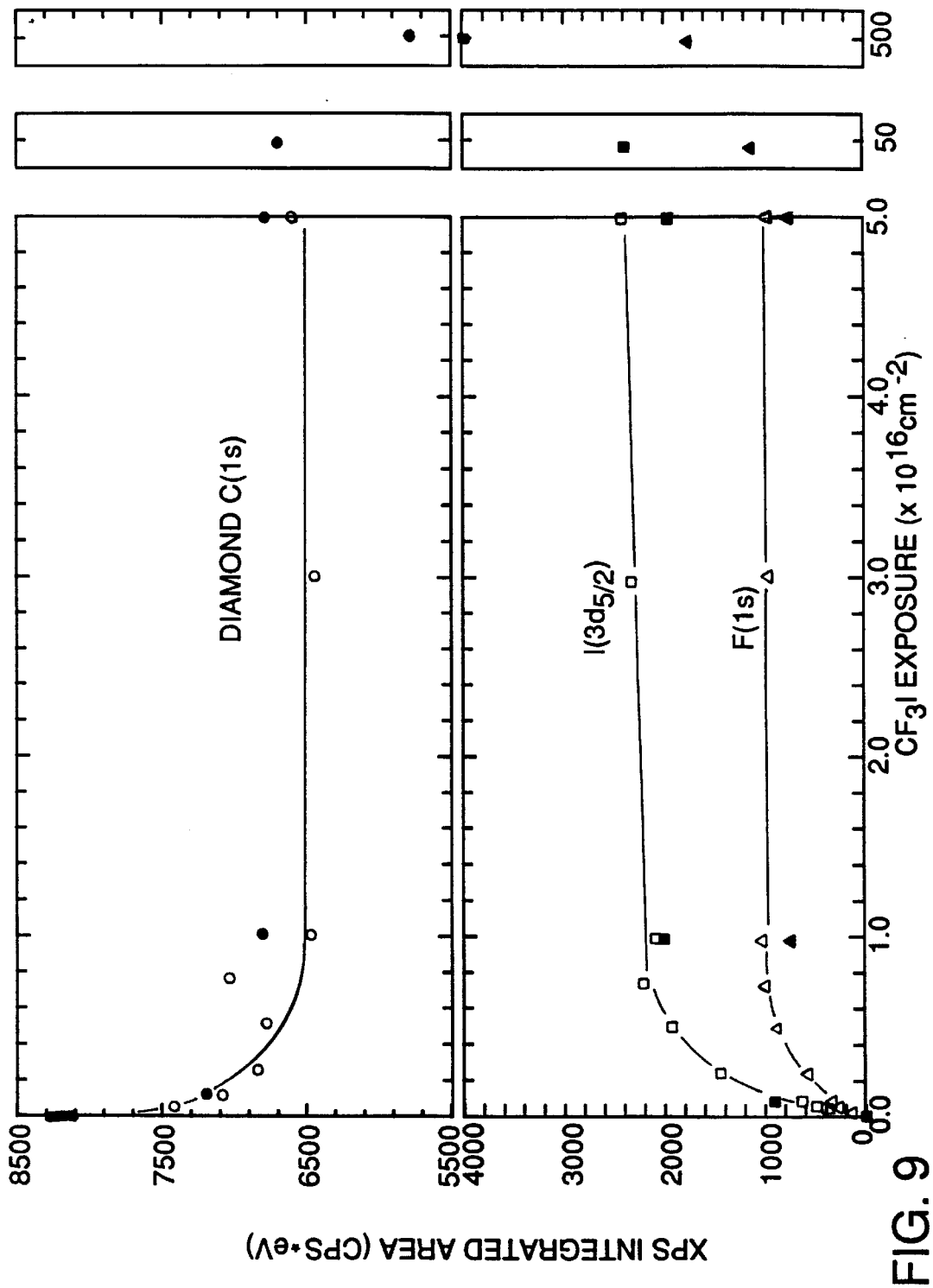
FIG. 9 is a plot of the C(1s) [circles], $I(3d_{5/2})$ [squares] and F(1s) [triangle] XPS integrated intensity as a function of $CF_3I$ exposure at about 119K.

Because of the complexity of the C$_4$F$_9$I molecule, detailed studies of the photoactivation of CF$_3$I on diamond (100) have also been carried out. The clean crystal is exposed to CF$_3$I(g) at a diamond surface temperature of 119K. Adsorption is observed, causing attenuation of the diamond C(1s) feature. FIG. 8 shows the F(1s), C(1s), I(3d), regions of the XP spectra following exposure 5×10$^{16}$ CF$_3$I/cm$^2$ at 119K. In addition to these measurements at high CF$_3$I exposure, both the F(1s) and the I(3d) XPS features are observed from the overlayer following an exposure of 2.5×10$^{14}$ CF$_3$I/cm$^2$ (data not shown). FIG. 9 shows a plot of the integrated diamond C(1s) [circles], F(1s) [triangles], and I(3d$_{5/2}$) [squares] peak areas as a function of CF$_3$I exposure at a diamond (100) temperature of 119K. The open data points represent adsorption experiments performed using D#2, and filled data points represent adsorption experiments performed using D#1. The data on the two diamonds are normalized using the diamond C(1s) intensity (following heating to 1450K) as a method to judge small differences in X-ray intensity and crystal geometry. It is seen for CF$_3$I that the rate of adsorption at 119K decreases significantly above an exposure of ~1×10$^{16}$ CF$_3$I/cm$^2$.

An important observation is that on heating the CF$_3$I-treated surface the diamond-related C(1s) feature does not shift to higher binding energy until the adsorbed layer is heated to ~250K. This binding energy increase is indicative that the photochemical fragments from CF$_3$I form strong chemisorption bonds with the diamond surface only after the overlayer has been heated to induce mobility of the photofragments.

Figure 10:
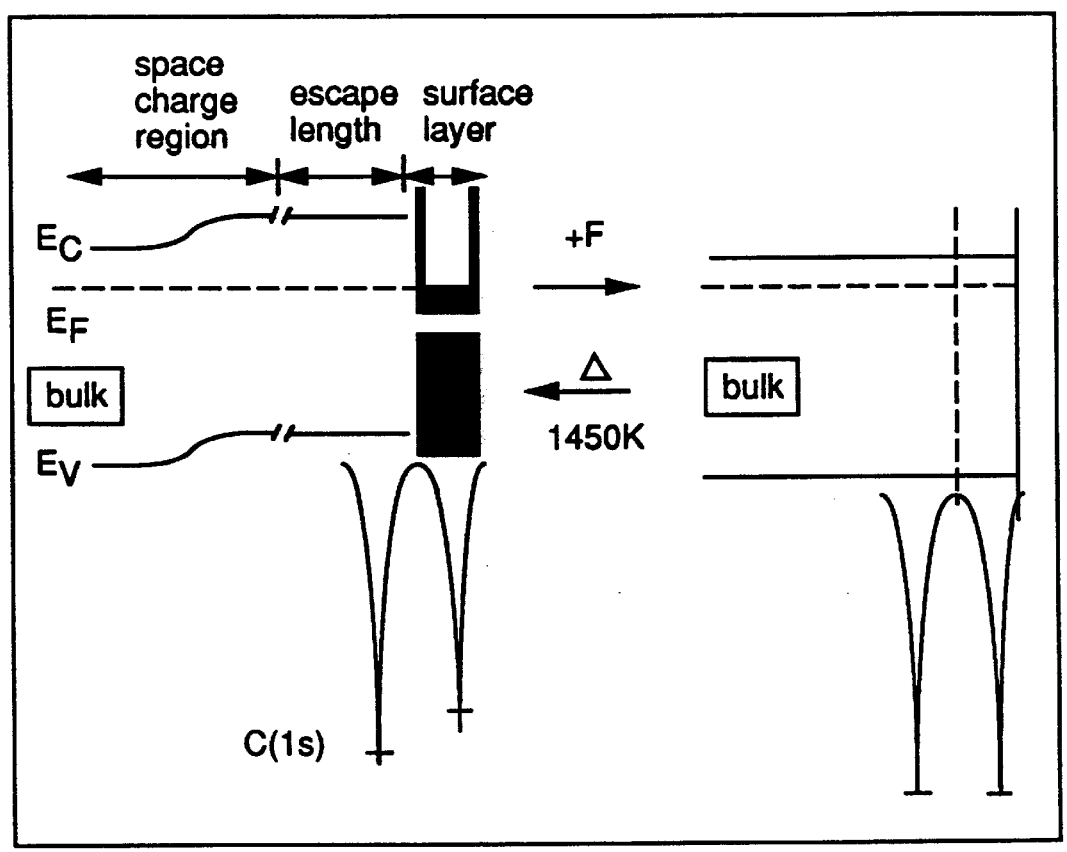
FIG. 10 is the effect of band bending for fluorination (and defluorination via heating) of diamond (100).

FIG. 10 shows, schematically, for an n-doped diamond crystal, upward band bending in the presence of partially filled surface states. F adsorption will produce a positive shift in the C(1s) peak bonding energy relative to the Fermi energy for the carbon atoms detected in the surface and subsurface region of the diamond as the bands flatten.

The observed photoprocesses for both C$_4$F$_9$I and CF$_3$I are likely due to a variety of processes induced by the X-radiation incident on the condensed layers of these molecules. Certainly direct excitation by X-rays, leading to photoionization processes causes dissociation of the molecules. In addition, secondary electron emission from the irradiated substrate is effective in breaking the C-I bonds in the fluoroalkyl iodide molecules. In FIG. 2 it is shown that the production of chemisorbed F atoms on the diamond surface is directly dependent on the time of irradiation of the condensed overlayer of C$_4$F$_9$I. It is well known that the weak C-I bond are photochemically broken in the alkyl iodides. FIG. 4 displays the thermal stability pattern of the surface fluorine species.

FIGS. 3 and 5 clearly indicate that C$_4$F$_9$ groups are able to be adsorbed on diamond (100) following photodissociation of C$_4$F$_9$I overlayers. The presence of CF$_2$ and CF$_3$ moieties in an approximate 3 to 1 ratio is found over the temperature range of their stability extending up to about 750K as judged from the two C(1s) features in FIG. 5. The detection of these moieties is indicative of chemisorbed C$_4$F$_9$ groups on the diamond surface. Studies in FIG. 6 of the F(1s) states at binding energies of 687.7 eV and ~685.8 eV correlate fairly well with the thermal behavior of the CF$_2$ and CF$_3$ groups in FIG. 5. The lower binding energy F(1s) state is assigned to chemisorbed F on diamond (100), produced from the thermal decomposition of the C$_4$F$_9$ groups below about 900K.

It is clear from FIG. 7 that photodissociation of the C-I bonds in C$_4$F$_9$I overlayers at 119K leads to hydrogen abstraction from the hydrogen-passivated diamond, producing trapped hydrogen iodide species. This is a very fortunate situation, enhancing the use of fluoroalkyl iodides for photochemical fluorination of diamond under practical conditions, since natural diamond surfaces are generally passivated by a hydrogen overlayer and might be expected to be unreactive. Thus, photochemistry of the fluoroalkyl iodides not only supplies active fluoroalkyl groups for attachment to the diamond, but also supplies iodine atoms for extraction of the surface hydrogen species making surface sites available for fluoroalkyl surface bonding.

At 119K, CF$_3$I adsorbs molecularly onto diamond (100). Upon heating to about 140K, molecular CF$_3$I desorption is detected by mass spectrometry. In this same temperature range, both the F(1s) and I(3d) signals decrease in yield while the C(1s) yield from the diamond substrate increases.

The use of $C_4F_9I$ as a fluorinating agent produces higher coverages of chemisorbed F than may be achieved using comparable conditions with $CF_3I$ overlayers. For $C_4F_9I$, the value of $N_F/N_C$ at 300K is 2.0 on diamond #1; upon heating to 700K, $N_F/N_C=0.6$, where $N_F/lN_C$ is the ratio of fluorine atoms to surface carbon atoms. For $CF_3I$-produced layers at 300K, $N_F/N_C=0.10-0.17$.

At diamond (100) surface temperatures near 300K, all $CF_3$ species (from $CF_3I$) have dissociated. For $C_4F_9$ species, all $CF_3(CF_2)_3$ groups have dissociated by about 750K–900K. At higher temperatures, depletion of surface fluorine begins to occur by a desorption process. This process occurs over a very wide temperature range culminating at ~1500K. The final F-depletion process appears to be similar for the two fluorinated iodides. For an n-doped diamond crystal (upward band bending in the presence of partially filled surface states), F adsorption will produce a positive shift in the C(1s) peak binding energy relative to the Fermi energy for the carbon atoms detected in the surface and subsurface region of the diamond as the bands flatten, as shown schematically in FIG. 10. Similar shifts were noted when the diamond (100) surface was exposed to atomic D. For atomic D, the C(1s) binding energy shift, at saturation, was ~+0.9 eV (for D#2). Upon fluorination, the C(1s) binding energy shift was ~+0.4 eV (for D#2) and was less than ~+0.1 eV for D#1. This comparison between D and F induced shifts is easily rationalized considering that the F coverage is less than 1 ML, whereas very high exposures to atomic D were employed.

An improved method for the fluorination of diamond surfaces using radiation-induced or ultraviolet light-induced activation of perfluoroalkyl iodide molecules adsorbed on the diamond surface is disclosed. The anchored fluoroalkyl groups provide an easily controlled source of fluorine for the production of chemisorbed fluorine on the diamond surface. The chemisorbed fluorine thermally decomposes over a temperature range from about 700K to 1500K. The fluorinated diamond surface has thermal stability to 1500K. The presence of passivating surface C-H groups on the diamond does not inhibit fluorination by this method. A fluorinated diamond product is made by this method.

Where particular embodiments of the present invention have been described above, for purposes of the illustration, it will be evident to those skilled in the art that numerous variations of the details may be made without departing from the invention as defined in the appended claims.

What is claimed is:

1. A fluorinated diamond made by the method comprising:
    depositing a layer of perfluorinated alkyl iodides having the formula $C_nF_{2n+1}I$ on a diamond surface;
    producing perfluorinated alkyl free radicals by photodecomposing C—I bonds of said perfluorinated alkyl iodides on said diamond surface;
    forming a perfluorinated alkyl layer by anchoring said photochemically induced perfluorinated alkyl free radicals to said diamond surface; and
    decomposing said perfluorinated alkyl layer on said diamond surface to produce chemisorbed fluorine on said diamond surface, wherein said perfluorinated alkyl iodide is selected from the group consisting of n=1 to 13.

2. The fluorinated diamond of claim 1, wherein the fluorinating perfluoroalkyl iodide is $C_4F_9I$.

3. The fluorinated diamond of claim 1, wherein the fluorinating perfluoroalkyl iodide is $CF_3I$.

4. The fluorinated diamond of claim 2, wherein attachment of fluorine to said diamond surface is characterized by band bending as surface states on said diamond are occupied through chemisorption.

5. The fluorinated diamond of claim 4, wherein iodine on said diamond surface is removed by heating from about 120K to 400K.

6. The fluorinated diamond of claim 5, wherein $C_4F_9$ surface species is stable from about 120 to 300K.

7. The fluorinated diamond of claim 6, wherein said $C_4F_9$ surface species thermally decomposes on said diamond surface from about 300 to 700K to produce said chemisorbed fluorine on said diamond surface.

8. The fluorinated diamond of claim 7, wherein said chemisorbed fluorine remains on said diamond surface from 500 to 1500K.

9. The fluorinated diamond of claim 8, wherein said diamond surface is characterized by retaining its reconstructed surface following fluorination.

10. The fluorinated diamond of claim 9, wherein F adsorption by said diamond will produce a positive shift in C(1s) peak binding energy, relative to the Fermi energy, for the carbon atoms detected in the surface and subsurface region of the diamond as the bands flatten.

11. The fluorinated diamond of claim 10, wherein the diamond surface has thermal stability up to about 1500K.

12. The fluorinated diamond of claim 11, wherein greater than one fluorine per surface carbon atom is chemisorbed on the diamond.

* * * * *